(12) United States Patent
Götzenberger

(10) Patent No.: US 7,455,051 B2
(45) Date of Patent: Nov. 25, 2008

(54) CONTROL DEVICE FOR PIEZO ACTUATORS OF FUEL INJECTION VALVES

(75) Inventor: Martin Götzenberger, Ingolstadt (DE)

(73) Assignee: Siemens Aktiengesellschaft, Munich (DE)

( * ) Notice: Subject to any disclaimer, the term of this patent is extended or adjusted under 35 U.S.C. 154(b) by 14 days.

(21) Appl. No.: 11/629,244

(22) PCT Filed: May 18, 2005

(86) PCT No.: PCT/EP2005/052274

§ 371 (c)(1),
(2), (4) Date: Dec. 11, 2006

(87) PCT Pub. No.: WO2005/121534

PCT Pub. Date: Dec. 22, 2005

(65) Prior Publication Data

US 2007/0227507 A1   Oct. 4, 2007

(30) Foreign Application Priority Data

Jun. 11, 2004   (DE) .................. 10 2004 028 516

(51) Int. Cl.
*F02M 51/00* (2006.01)
*H01L 41/00* (2006.01)
(52) U.S. Cl. .................. 123/478; 310/316.03; 310/317
(58) Field of Classification Search .............. 123/478, 123/498; 310/316.03, 317
See application file for complete search history.

(56) References Cited

U.S. PATENT DOCUMENTS

| 5,036,263 | A | * | 7/1991 | Yamada et al. .............. 318/116 |
| 5,479,062 | A | * | 12/1995 | Yoshino ................. 310/316.03 |
| 5,986,360 | A | | 11/1999 | Gerken et al. |
| 6,563,252 | B2 | | 5/2003 | Schrod |
| 2004/0145273 | A1 | * | 7/2004 | Khoury et al. ......... 310/316.03 |
| 2007/0090813 | A1 | * | 4/2007 | Gotzenberger .............. 323/222 |

FOREIGN PATENT DOCUMENTS

DE    197 34 895 A1    2/1999
DE    199 44 733 A1    3/2001

(Continued)

OTHER PUBLICATIONS

The 30th Annual Conference of IEEE Industrial Electronics Society, Nov. 2-6, 2004, Busan, Korea.*

(Continued)

*Primary Examiner*—Stephen K. Cronin
*Assistant Examiner*—J. Page Hufty
(74) *Attorney, Agent, or Firm*—Laurence A. Greenberg; Werner H. Stemer; Ralph E. Locher

(57) ABSTRACT

A control device for piezo actuators of fuel injection valves includes a DC/DC up converter and an output stage configured as a SEPIC converter having a second transistor and a coupling capacitor connected in series on the input end. The DC/DC up converter is configured as a flyback converter having a transformer whose one connection of its secondary winding is connected to the connecting node of the second transistor and the coupling capacitor and whose other connection of its secondary winding is connected to the other connection of the coupling capacitor via a diode.

4 Claims, 1 Drawing Sheet

FOREIGN PATENT DOCUMENTS

| | | |
|---|---|---|
| DE | 199 52 950 A1 | 6/2001 |
| DE | 101 13 801 A1 | 10/2002 |
| DE | 102 51 685 A1 | 6/2003 |
| EP | 0 379 182 A2 | 7/1990 |
| EP | 1 418 328 A2 | 5/2004 |
| WO | 01/33061 A1 | 5/2001 |
| WO | WO 01/33061 A1 | 5/2001 |

OTHER PUBLICATIONS http://www.powerdesigners.com/InfoWeb/design_center/articles/DC-DC/converter.shtm.*

* cited by examiner

CONTROL DEVICE FOR PIEZO ACTUATORS OF FUEL INJECTION VALVES

BACKGROUND OF THE INVENTION

Field of the Invention

The invention relates to a control device for piezo actuators of fuel injection valves according to claim 1, particularly of piezo fuel injection valves for internal combustion engines in motor vehicles.

Piezo actuators require a very high voltage and dynamic response of the control device controlling them. The power loss which occurs as well as the space requirement and also the costs prove to be generally problematical for the current highly integrated control devices.

With regard to a known control device for operating piezo actuators for fuel injection valves, which is used in a similar embodiment for example in the A8 model of motor vehicle from the Audi company, see FIG. 2, the onboard electrical system voltage (12V) is converted into a high voltage (of up to 300V) for controlling the piezo actuators by way of a filter (L1 and C1 to C4) and two up converters or one up converter and one up/down converter connected in series. The onboard electrical system voltage is fed to a DC/DC up converter (L2, T1, D1 and C5, C6) which builds a high voltage (of up to 300V) at a single-ended intermediate circuit capacitor C5, C6. In this manner, the high dynamic response is buffered and the voltage is raised.

The DC/DC up converter required for this is a self-contained unit. Connected to the intermediate circuit capacitor C5, C6 is an output stage which is designed as an up or up/down converter (boost or buck-boost converter), for example a SEPIC converter (single-ended primary inductance converter, consisting of L3, L4, D2 to D4, T2, T3 and C7 to C9) in a modified form, which ultimately controls the piezo actuators P1 to P4, in FIG. 2 for example for four fuel injection valves, by way of a changeover switch U.

The SEPIC output stage, which requires about 80V as its input voltage since it can also step up the voltage further itself, in turn forms an independent converter. In the control device, two converters acting independently of one another are therefore incorporated in tandem arrangement. Each unit is optimized in its own right, from which results a particular level of efficiency, space requirement and price.

With regard to the output stage, although the SEPIC topology has been adopted, but the construction chosen is extremely untypical because the coupling capacitor C7, C8 essentially has an energy storage function and the input choke L3 only needs to recharge small quantities of energy.

SUMMARY OF THE INVENTION

The object of the invention is to create a control device for piezo actuators of fuel injection valves with an improved level of efficiency, lower space requirement and reduced costs.

This object is achieved according to the invention by a control device for piezo fuel injection valves according to the features described in claim 1.

Advantageous developments of the invention are set down in the subclaims.

An embodiment according to the invention will be described in detail in the following with reference to a schematic drawing. In the drawings:

DESCRIPTION OF THE PREFERRED EMBODIMENTS

Figure 2:
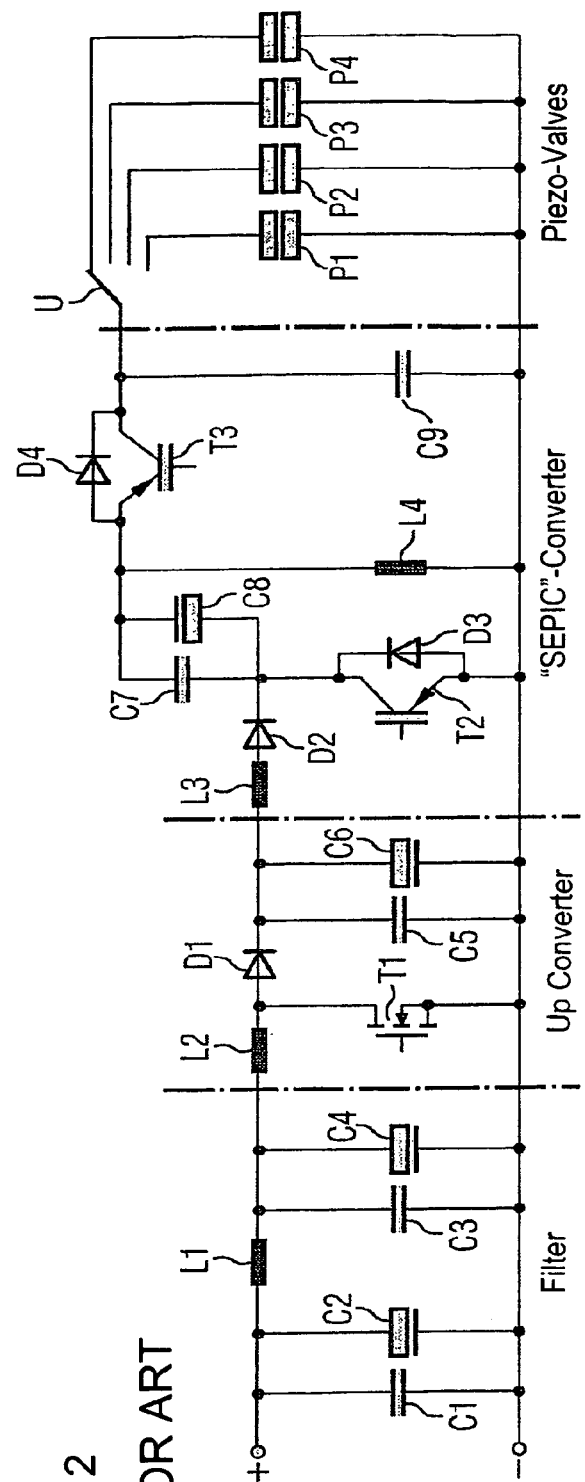
FIG. 2 shows a control device known per se.

FIG. 2 shows the known embodiment already described further above of a control device for piezo actuators of fuel injection valves.

A filter, consisting of a first choke L1 and capacitors C1 to C4, is required in order to prevent disruption to the 12V onboard electrical system on account of the high drive frequency of the up converter. The capacitors C1 and C2 connected in parallel are situated between the positive pole (+) and the negative pole (−) of the onboard electrical system voltage, 12V for example. Likewise located between the positive pole and the negative pole is a series circuit comprising a first choke L1 and two capacitors C3 and C4 connected in parallel. The connecting point of choke L1 and capacitors C3, C4 is the filter connection, which is also the input to an up converter.

The up converter consists of a series circuit comprising a second choke L2 and a first transistor T1, which is located between the filter output and the negative pole, and of a series circuit comprising a first diode D1 and an intermediate circuit capacitor, consisting of two capacitors C5 and C6 connected in parallel, said series circuit being located between the connecting point of the second choke L2 and the first transistor T1 and the negative pole, whereby the first diode D1 is conducting in the direction from the second choke L2 to the intermediate circuit capacitor C5, C6. Transistor T1 of the up converter functions as a switch which is switched on and off by means of a control voltage that is pulse width modulated by the output voltage present at the intermediate circuit capacitor C6, and in this manner brings about a high, preferably constant output voltage of a desired amplitude at the intermediate circuit capacitor C5, C6.

During the energization phase for the first transistor T1, the input voltage (onboard electrical system voltage) largely drops off at the second choke L2 and the current flowing through it increases. When the transistor T1 turns off, then the current continues to flow by way of the first diode D1 and charges the intermediate circuit capacitor C5, C6.

By using this voltage present at the intermediate circuit capacitor C5, C6, in each case one of the piezo actuators P1 to P4 of the injection valves is driven in pulsed fashion by means of the SEPIC converter—which if necessary further increases the voltage present at the intermediate circuit capacitor C5, C6—connected downstream of the up converter. The timing of the energization of the piezo actuators is ultimately effected by means of a motor control (not shown) by way of transistors T2, T3 and the changeover switch U, which can also be located, other than as illustrated in FIG. 2, between the piezo actuators and the negative pole of the onboard electrical system voltage.

The general mode of operation of a SEPIC converter is described for example in "Intersil Application Note No. AN9208, April 1994, pp. 11-181.

The SEPIC converter, which is a modified form constitutes the output stage in this embodiment, is constructed as follows: Between the output of the up converter—the connecting point between the first diode D1 and the intermediate circuit capacitor C5, C6—and the negative pole is located a series circuit consisting of a third choke L3, a second diode D2 and a second transistor T2, whereby the second diode D2 is conducting in the direction from the third choke D3 to the second transistor T2.

Between the connecting point of second diode D2 and second transistor T2 and the negative pole is located a further series circuit comprising a coupling capacitor, consisting of two capacitors C7 and C8 connected in parallel, and a fourth choke L4.

Between the connecting point of the coupling capacitor C7, C8 and fourth choke L4 and the negative pole is situated a series circuit comprising a third transistor T3 and a capacitor C9, whereby the changeover switch U connects the connecting point between the third transistor T3 and the capacitor C9 to the piezo actuators P1 to P4 of the fuel injection valves.

The two transistors T2 and T3 take the form for example of IGBTs, whereby a (third and fourth) diode D3, D4 is located in each case between the emitter and the collector of the transistor, said diode being conducting from the emitter to the collector.

The charging and discharging of the piezo fuel injection valves P1 to P4 takes place as follows:

At the beginning of the charging process the chokes L3 and L4 are current-free. The piezo actuator P1 to P4 to be charged is selected with the changeover switch U. The second transistor T2 is made conducting, the connecting point between choke L4, coupling capacitor C7, C8 and third transistor T3 receives negative potential. A current builds up in the choke L4.

As soon as this current reaches a desired value, the second transistor T2 is made nonconducting and the current is released by way of the fourth diode D4 and the capacitor C9, whereby the energy stored in the choke L4 is transferred to the capacitor C9 and the selected piezo actuator. As soon as the current through the choke L4 has dropped to zero, the next pulse begins. These pulses are repeated until such time as the piezo actuator has been charged to a desired value. The next operating cycle then begins.

Through the choke L3, a small current builds up during the charging process but this has no effect on the fundamental course of events. It can be removed in the fourth choke L4 in order to increase the accuracy of the measurement signal for the current. The current through the choke L3 charges the coupling capacitor C7, C8 up again to the value of the intermediate circuit C5, C6, thereby resulting in a voltage overshoot. The voltage overshoot is dependent on a large number of factors and affects the accuracy that can be achieved.

At the beginning of the discharging process, the capacitor C9 is charged and the choke L4 is current-free. The transistor T3 is made conducting in order to build up a current in the choke L4 during discharging of the piezo actuator. When this current has reached a desired value, the transistor T3 is made nonconducting, the current is released by way of the coupling capacitor C7, C8 and the third diode D3. The energy is transferred to the coupling capacitor C7, C8. As soon as this current has dropped to zero, the next pulse begins. These pulses are repeated until such time as the piezo actuator has been discharged. The next operating cycle then begins.

In addition to the described operation at the gap boundary (next operating cycle begins on reaching zero current), the output stage can also function continuously and discontinuously.

Figure 1:
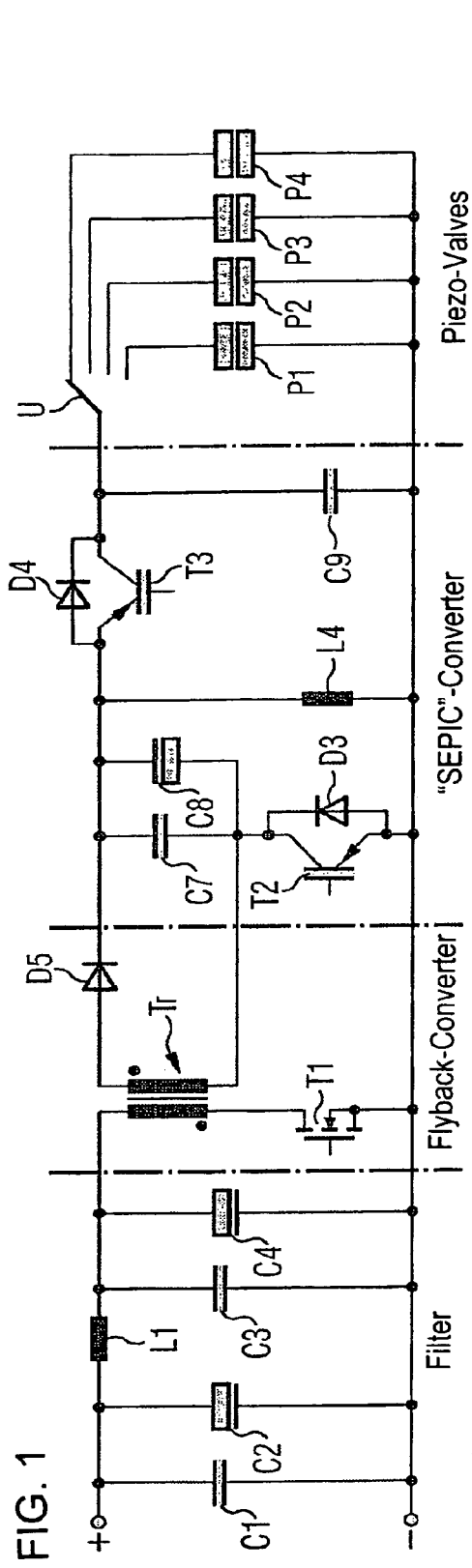
FIG. 1 shows a control device according to the invention for piezo actuators of fuel injection valves.

A control device according to the invention for piezo actuators of fuel injection valves is illustrated in FIG. 1.

A filter, consisting of the capacitors C1 to C4 and the first choke L1, at whose connection is again located a DC/DC up converter, but this time taking the form of a reverse converter, is situated between the positive pole (+) and the negative pole (−) of the onboard electrical system voltage, as shown in FIG. 2.

This up converter consists of a transformer Tr whose primary coil is arranged in series with a switching transistor T1 between the filter connection and the negative pole. The up converter is again followed, as in the case of the known embodiment according to FIG. 2, by the up converter taking the form of a SEPIC converter in which however the third choke L3 and a diode, the second diode D2 for example, are no longer present.

The one connection of the isolated secondary winding of the transformer Tr is connected directly to the connecting point of the coupling capacitor C7, C8 and the second transistor T2, while the other connection is connected by way of a fifth diode D5 to the other connection of the coupling capacitor C7, C8, whereby the fifth diode D5 is conducting in the direction of the secondary winding to this other connection of the coupling capacitor C7, C8. The diode D5 can however be situated in the connecting line between the connecting point of the coupling capacitor C7, C8 and second transistor T2 and the secondary winding of the transformer Tr.

The remainder of the circuit of the SEPIC converter (L4, C9), the changeover switch U and the piezo actuators P1 to P4 of the fuel injection valves corresponds to the circuit according to FIG. 2.

The charging and discharging of the piezo actuators P1 to P4 of the fuel injection valves by means of the control device according to the invention takes place essentially in the same manner, in pulsed fashion, as described further above with regard to the known embodiment according to FIG. 2.

The main difference and advantage of the solution according to the invention is however the fact that in this case the recharging current for the coupling capacitor C7, C8 does not have a negative influence on the current measurement in L4. A voltage overshoot occurs only in the event of an extremely long pause between charging and discharging.

The circuit according to the invention according to FIG. 1 has the following advantages compared with the known circuit according to FIG. 2:

the coupling capacitor C7, C8 now assumes the function of the intermediate circuit capacitor C5, C6, which consequently, together with the second diode D2 and the third choke L3, becomes superfluous and can be dispensed with;

space is gained as a result of dispensing with the components C5, C6, D2 and L3 (approx. 2 cm$^2$);

costs are saved as a result of dispensing with the components C5, C6 and D2;

by replacing the two chokes L2 and L3 with the transmitter Tr, costs are reduced to around 60% of the costs for the two chokes L2, L3;

the losses for the overall system are reduced because the considerable losses (approx. 2 W) in choke and diode do not apply, whereas the losses for the flyback converter are only insignificantly higher than those for the boost converter. An improved level of efficiency overall is thereby achieved as a result;

the power supply to the drivers for the semiconductor switches can be substantially simplified since the up converter taking the form of a flyback converter (by way of further secondary windings) is able to simultaneously control a plurality of output voltages, whereas in the known variant of the up converter further components for separate DC/DC voltage converters are required for the driver supply;

the recharging current for the coupling capacitor C7, C8 does not have a negative influence on the current measurement in the choke L4, with the result that the accuracy increases;

a voltage overshoot during recharging of the coupling capacitor C7, C8 can only occur in the event of an extremely long pause between charging and discharging (a situation which practically never occurs with the intended use), with the result that the accuracy increases.

I claim:

1. In an internal combustion engine having fuel injection valves operated by respective piezo actuators, a control device for the piezo actuators, comprising:
   a series circuit of a flyback converter for up-converting an electrical system voltage of an onboard DC electrical system and an output stage for controlling the piezo actuators;
   said flyback converter having a transformer with a secondary winding;
   said output stage being formed as a SEPIC converter having an input side with a series circuit of a transistor and a coupling capacitor connected via a node;
      said transistor having an emitter connected to a negative potential of the onboard DC electrical system;
      said coupling capacitor having a first connection connected to said transistor and a second connection;
   a first connection of said secondary winding being connected to a node between said transistor and said coupling capacitor; and
   a diode connected between a second connection of said secondary winding and said second connection of said coupling capacitor, said diode conducting in a direction from said secondary winding of said transformer to said second connection of said coupling capacitor.

2. A control device for piezo actuators of fuel injection valves, comprising:
   a DC/DC up converter formed of a flyback converter with a transformer;
   a SEPIC converter forming an output stage connected in series with said DC/DC up converter, said output stage having an input side with a series circuit of a transistor and a coupling capacitor, said transistor having an emitter connected to a negative pole of an onboard electrical system voltage, said coupling capacitor having a first connection connected to said transistor and a second connection; and
   a changeover switch connected between said output stage and the piezo actuators for controlling the piezo actuators;
   said transformer having a secondary winding with a first connection connected to a node between said transistor and said coupling capacitor of said SEPIC converter, and a second connection; and
   a diode connected between said second connection of said secondary winding of said transformer and said second connection of said coupling capacitor of said SEPIC converter, said diode conducting in a direction from said secondary winding of said transformer to said second connection of said coupling capacitor.

3. The control device according to claim 2, wherein said diode is connected between said secondary winding of said transformer and the node between said transistor and said coupling capacitor.

4. The control device according to claim 2, configured for implementation in an internal combustion engine of a motor vehicle.

* * * * *